United States Patent [19]

McConnell

[11] Patent Number: 5,515,013
[45] Date of Patent: May 7, 1996

[54] FIXED COMPROMISE EQUALIZATION FOR A DUAL PORT FM MODULATOR

[75] Inventor: Peter McConnell, Burnaby, Canada

[73] Assignee: Sierra Wireless, Richmond, Canada

[21] Appl. No.: 423,951

[22] Filed: Apr. 18, 1995

[51] Int. Cl.⁶ .................................................. H03C 3/08
[52] U.S. Cl. ........................... 332/124; 332/128; 455/43; 455/110; 455/63
[58] Field of Search ..................... 332/123, 124, 332/127, 128; 455/43, 110, 63

[56] References Cited

U.S. PATENT DOCUMENTS 3,628,134  12/1971  Anderson ................................ 332/118
4,743,867  5/1988   Smith ..................................... 332/127

Primary Examiner—Siegfried H. Grimm
Attorney, Agent, or Firm—Burns, Doane, Swecker & Mathis

[57] ABSTRACT

A dual port frequency modulator and method for eliminating the undesired affects caused by high port/low port phase differences in a standard dual port frequency modulator. The frequency modulator includes an inverse filter stage coupled to the input of a modulator stage including a first high port processing path for processing high frequency components of a modulation signal and a second low port processing path for processing low frequency components of a modulation signal. The outputs of the high and low paths are coupled to separate ports of a voltage controlled oscillator. The impulse response of the inverse filter is designed to be the inverse of the impulse response of the modulator stage. The filter functions to counter-act the adverse effects caused by the delay difference in the high and low processing paths of the modulator stage such that the overall response of the dual port frequency modulator is significantly improved.

7 Claims, 4 Drawing Sheets

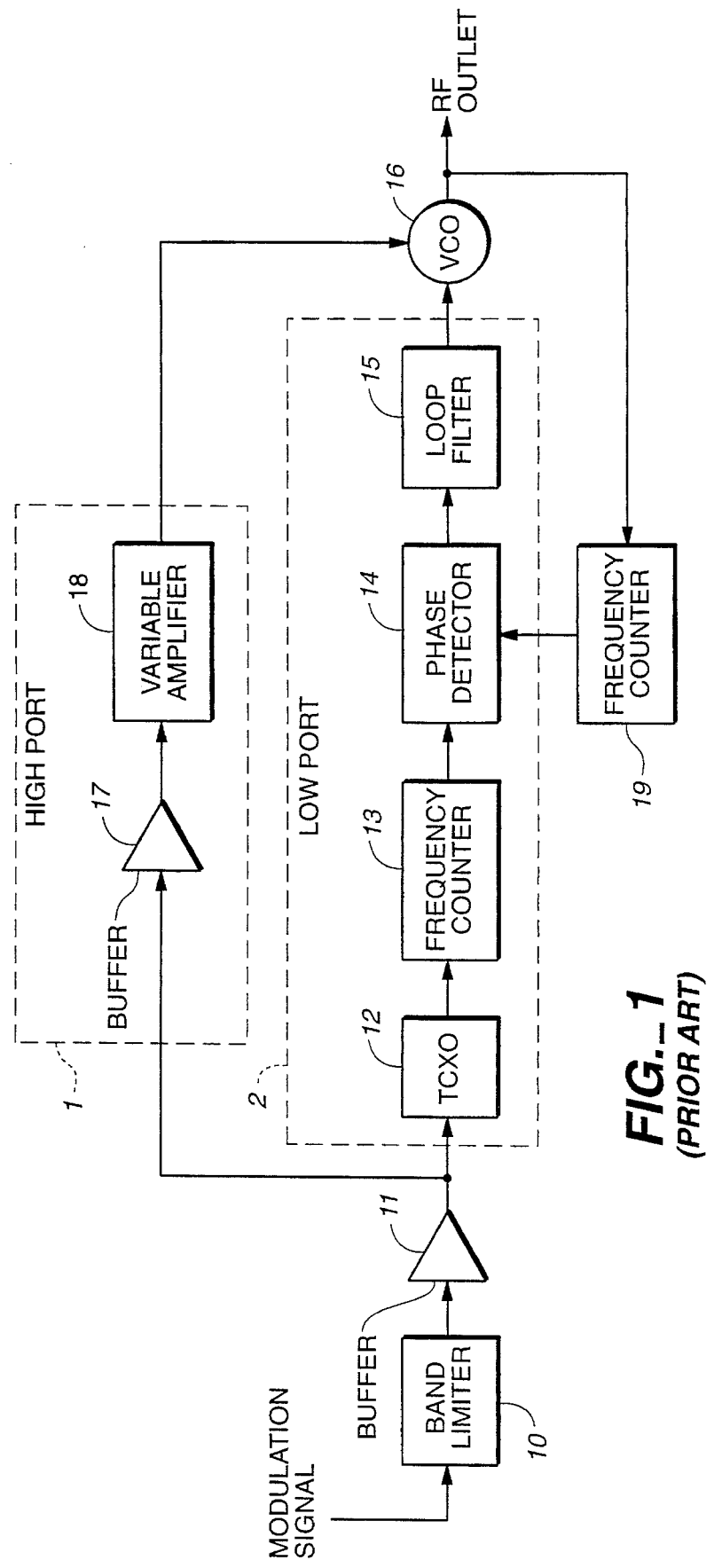
FIG._1
*(PRIOR ART)*

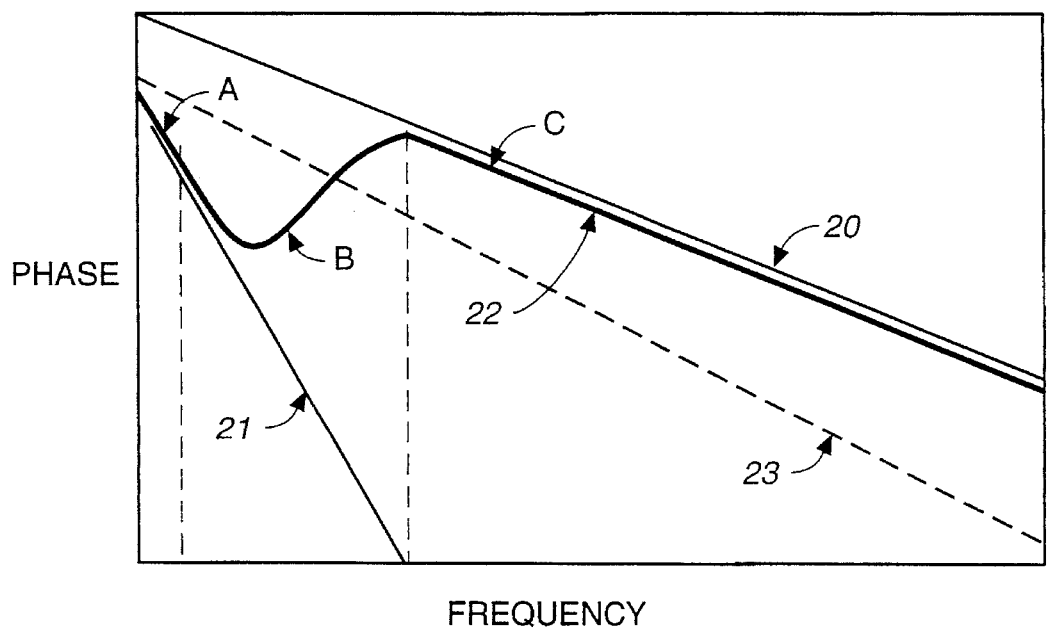
FIG._2
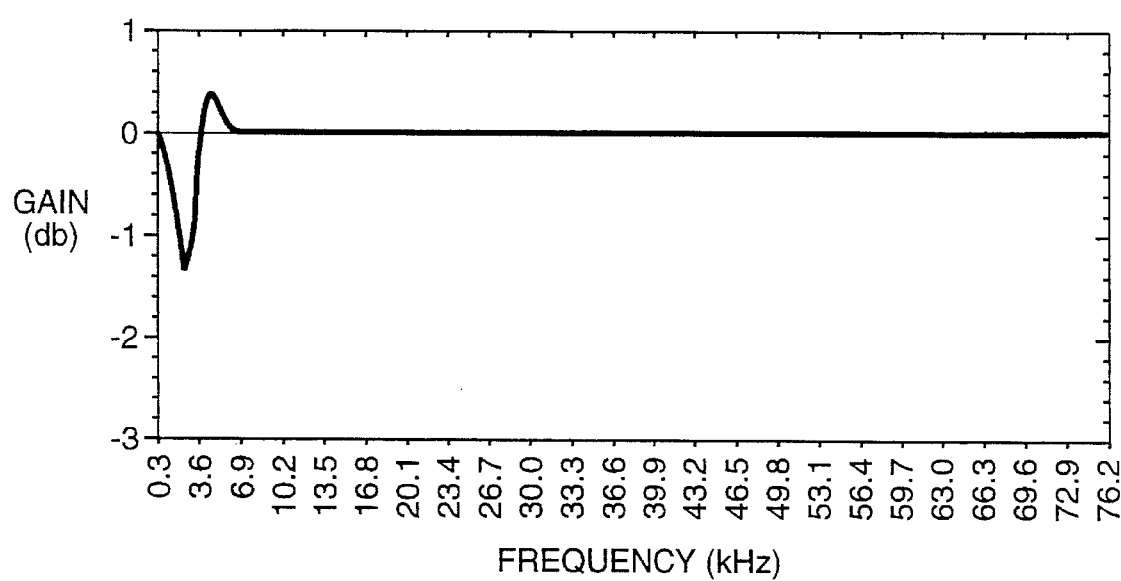
FIG._3

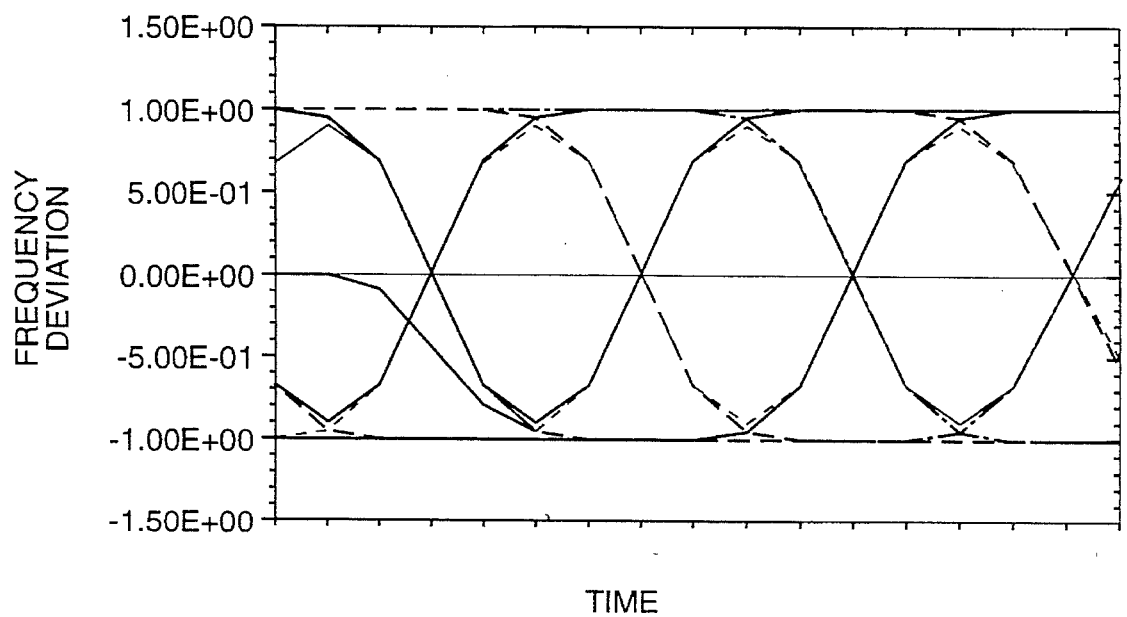
FIG._4A
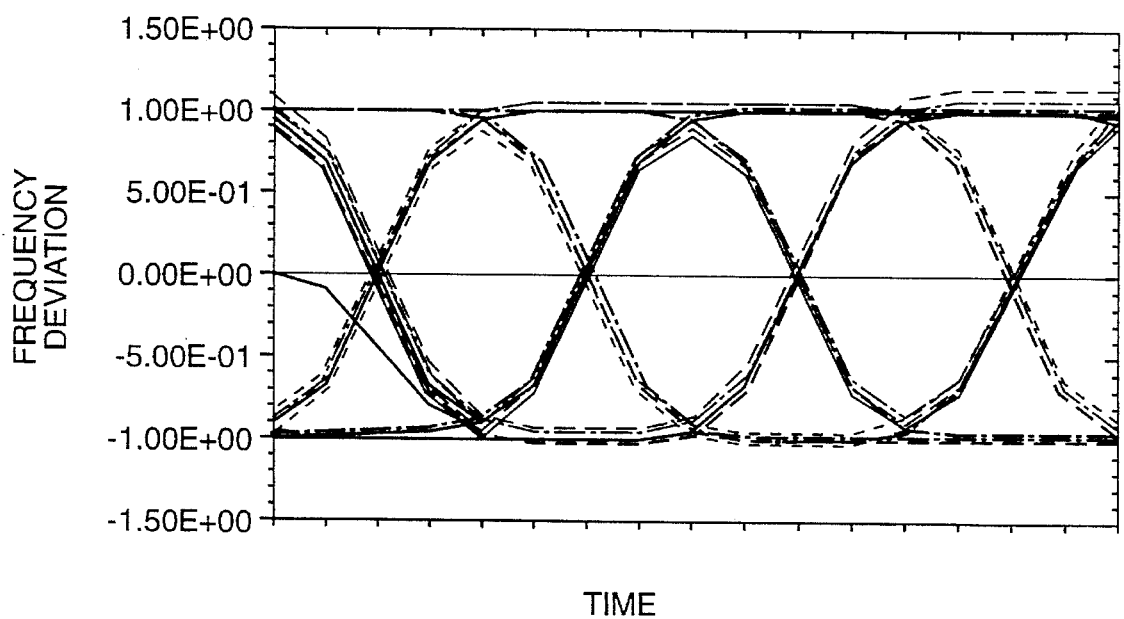
FIG._4B

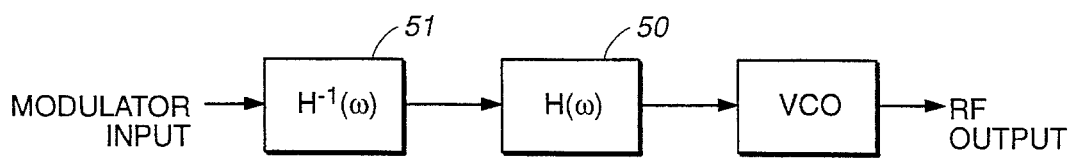
FIG._5
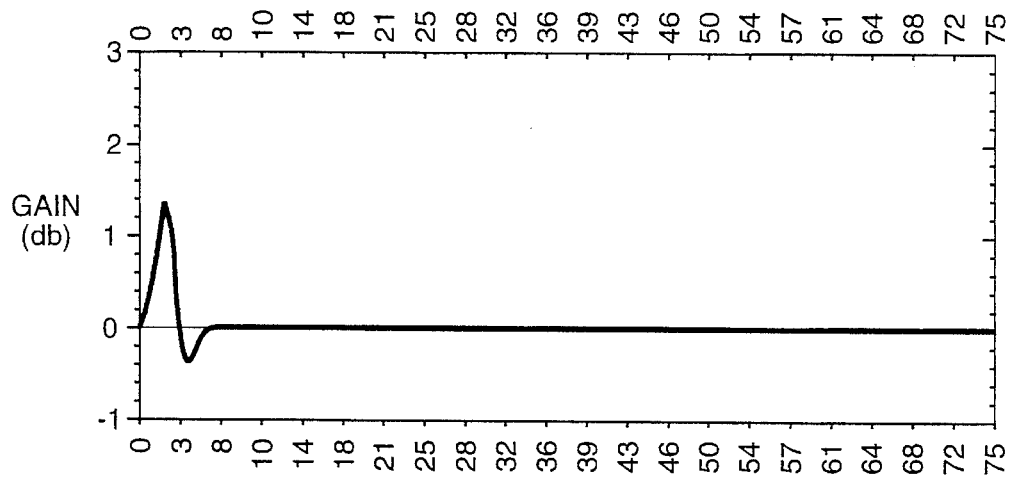
FIG._6
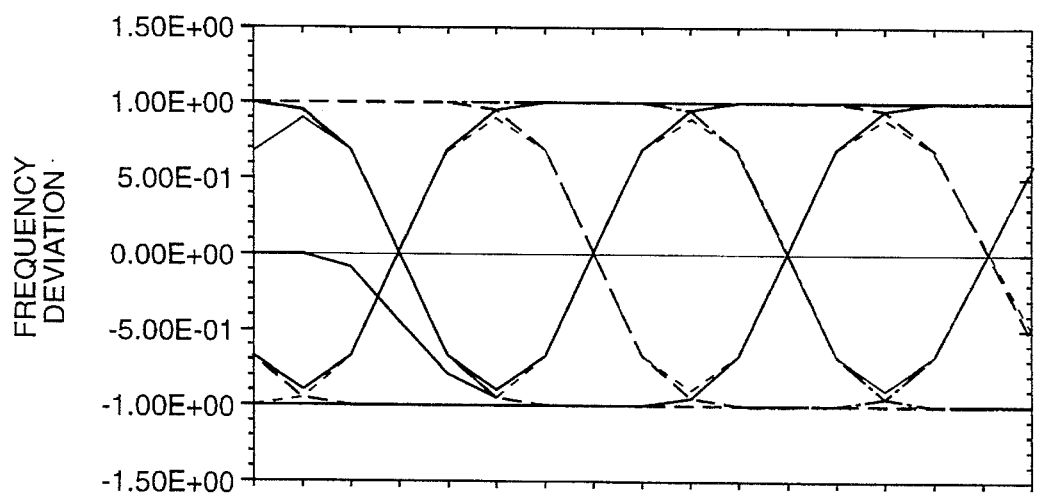
FIG._7

5,515,013

FIXED COMPROMISE EQUALIZATION FOR A DUAL PORT FM MODULATOR

FIELD OF THE INVENTION

The present invention generally relates to dual port modulators and, more particularly, to systems for reducing distortion in dual port modulators.

BACKGROUND OF THE INVENTION

It is known in the field of signal processing that frequencies close to DC (i.e. zero frequency) are difficult to modulate. One prior art circuit used to overcome this problem is a dual port frequency modulator. The dual port frequency modulator is designed to modulate frequencies from zero frequency and greater.

The conventional dual port frequency modulator includes two data processing paths: a high frequency processing path for modulating high frequency components of the modulation signal and a low frequency processing path for modulating low frequency components. The high frequency processing path typically comprises a buffer and a variable gain amplifier which function to account for frequency deviation and gain imbalances, respectively, between the high and low processing paths. The low frequency processing path, on the other hand, comprises considerably more signal components than the high path due to the additional signal processing needed to modulate lower frequency signals. The lower path often includes a series coupled temperature controlled crystal oscillator (TCXO), two frequency counters, a first phase detector, and a loop filter. The outputs of the high and low frequency paths are both coupled to a separate input of a voltage controlled oscillator (VCO). The VCO effectively adds the two input signals and outputs the desired frequency modulated signal.

The main drawback for the above described modulator design is that, due to the different structures of the high and low paths, the systems have different time delays between the modulation input and the inputs to the VCO. This time delay difference equates to a phase delay difference between the high and low paths which results in a non-linear phase response in the vicinity of the loop filter cut-off frequency for the above described dual port modulator. Due to this non-linear phase response, signals in the vicinity of the loop filter cutoff frequency have approximately the same amplitudes but different phases. As a result, out-of-phase signals cancel and some attenuation occurs in the output signal of the modulator, thereby affecting the impulse response (i.e. gain and magnitude response) of the modulator. The manner in which the impulse response is affected is that the gain of the modulator in the region of the loop filter frequency "dips". The magnitude response, in turn, affects the modulation index, and in particular, degrades the frequency deviation versus time response of the prior art modulator.

SUMMARY OF THE INVENTION

The present invention provides a method and system for eliminating the undesired effects caused by high port/low port phase differences in a dual port frequency modulator. The present invention is achieved by pre-distorting the modulation signal with an "inverse filter", referred to as a fixed compromise equalizer, prior to being coupled to the input of the dual port modulator. The inverse filter has a magnitude and phase response (i.e. impulse response) that is essentially the inverse of the impulse response of the non-ideal dual port modulator. Specifically, the inverse filter provides an impulse response in which the phase delay is compensated for in the region in which attenuation occurs in the non-ideal modulator response. In one embodiment of the present invention the inverse filter response is incorporated into a pre-existing pre-filtering stage, such as a pulse shaping filter. In this way little or no additional hardware is needed to implement the improved modulator of the present invention.

BRIEF DESCRIPTION OF THE DRAWINGS

FIG. 1 shows a prior art dual port frequency modulator.

FIG. 2 shows the phase response for each of the low and high ports of a prior art dual port frequency modulator, the composite phase response of the prior art dual port frequency modulator, and the ideal phase response for a dual port frequency modulator.

FIG. 3 shows the typical magnitude response for a prior art dual port frequency modulator.

FIG. 4A shows an ideal eye diagram for GMSK with h=0.50 for a prior art modulator.

FIG. 4B shows the effects of phase distortion on the eye diagram for a prior art dual port frequency modulator.

FIG. 5 shows the improved dual port modulator of the present invention including a pre-distorter stage.

FIG. 6 shows the magnitude response of the fixed compromise equalizer of the present invention.

FIG. 7 shows the actual eye diagram for GMSK with h=0.50 for the dual input modulator as shown in FIG. 5.

DETAILED DESCRIPTION

In FIG. 1, which shows a conventional dual port frequency modulator, the input of the dual port frequency modulator is typically coupled to a GMSK bandwidth limiter 10 which functions to initially bandlimit the modulation signal to a particular frequency range. Next, the bandlimited input signal is passed through buffer 11 which functions to adjust the overall deviation frequency of the modulator. This is performed to ensure that the peak-to-peak voltage of the modulation input signal corresponds to a standardized deviation frequency ($f_d$). Typically, the deviation frequency is adjusted such that a 1.00 volt peak-to-peak voltage corresponds to a deviation frequency of 4.8 kHz. The output signal from buffer 11 is coupled to two signal processing paths within the modulator: a high frequency processing path and a low frequency processing path.

The low frequency path is responsible for modulating lower spectral frequency components. This path comprises temperature compensated crystal oscillator 12 (TCXO) which generates a reference frequency in the 10 MHz range. This reference frequency is divided down by a frequency counter 13 to a lower reference frequency in the 10–50 kHz range. This reference frequency signal is coupled to a first input of phase detector 14. Phase detector 14 functions to output a voltage signal proportional to the phase difference between the reference frequency signal coupled to its first input and the signal coupled to its second input. The output signal of the phase detector is passed through loop filter 15 which filters out all frequency components below the loop filter cut-off frequency ($f_{loop\ cut-off}$). The filtered signal is then coupled to a first input of voltage controlled oscillator 16 (VCO). VCO 16 essentially adds the two signals from each of the high and low paths and outputs a signal having a frequency proportional to the voltages of the inputs signals.

The high frequency path is responsible for modulating the higher spectral frequency components. This path comprises buffer 17 and variable gain amplifier 18. Buffer 17 functions to balance the deviation frequency between the high and low signal processing paths and amplifier 18 functions to scale the output signal of the second buffer so as to balance the gain between the first and second signal processing paths. The output of amplifier 18 is coupled to a second port of VCO 16. The second port of the VCO effectively bandlimits the high frequency signal from the high frequency signal processing path such that only frequency components above the loop filter cut-off frequency affect the VCO from this port. The output of VCO 16 is fed back to the second input of phase detector 14 through frequency counter 19.

FIG. 2 shows a composite phase response 22 of the prior art dual port modulator shown in FIG. 1. In FIG. 2, the phase response 20 is shown for the high path and the phase response 21 for the low path. Because the low path contributes a signal only having significant amplitude below $f_{loop\ cut-off}$, the frequency components of phase response 22 below $f_{loop\ cut-off}$ (section A) appear to have a phase response that is the same as low path response 21. Similarly, because the high path contributes a signal only having significant amplitude above $f_{loop\ cut-off}$, frequency components of phase response 22 above $f_{loop\ cut-off}$ (section C) appear to have a phase response that is the same as high path response 20. However, the phase response 22 at frequencies in the vicinity of $f_{loop\ cut-off}$ (section B) is determined by a composite signal originating from both of the high and low paths. This composite signal causes phase response 22 to be non-linear for frequencies within section B resulting in phase distortion within that frequency region.

Due to the above-described phase delay distortion, the signals from each of the high and low paths at the frequencies in the vicinity of $f_{loop\ cut-off}$ have approximately the same amplitude but different phases. As a result, some of these out-of-phase signals cancel each out and cause attenuation in the magnitude response of the modulator.

FIG. 3 shows the attenuation effect on the amplitude response of the prior art modulator having a loop cut-off frequency of approximately 3.6 kHz, (i.e. $f_{loop\ cut-off}$=3.6 kHz). As seen in FIG. 3, a "dip" (indicated by 30) in gain occurs approximately at 3.6 KHz indicating gain attenuation. Similarly, some of the signals in the vicinity of the loop filter cut-off frequency add together resulting in peak 31 indicating a boost in gain.

This attenuation can be mathematically described in the following manner. The output voltage signal from VCO 16, S(t), can be represented as the sum of two signals, $v_1(t)$ and $v_2(t)$. Because $v_1(t)$ and $v_2(t)$ are low pass and high pass filtered versions of the same signal, S(t) can be expressed as follows:

$$S(t) = v_1(t) + v_2(t) \qquad \text{eq. 1}$$
$$= m(t)h_{lp}(t) + m(t)h_{hp}(t)$$

where m(t) is the modulation input signal and $h_{lp}(t)$ and $h_{hp}(t)$ are the impulse response functions of the low and high ports, respectively. At low frequencies, the signal S(t) is primarily the resultant convolution of the low pass response with modulation signal m(t). In other words $m(t)h_{hp}(t)$@0 in equation 1 and $S(t)= m(t)h_{lp}(t)$. At high frequencies, the signal S(t) is primarily the resultant convolution of the high pass response with signal m(t), (i.e. $m(t)h_{lp}(t)$@0 and $S(t)= m(t)h_{hp}(t)$).

However, at the $f_{loop\ cut-off}$ both v1 and v2 contribute to signal S(t). Thus, S(t) at $f_{loop\ cut-off}$ can be expressed, using $m(t)=\cos(f_c t)$ and $h_{lp}(t)=h_{hp}(t)=0.50$, as follows:

$$\begin{aligned} S(t) &= v_1(t) + v_2(t) \qquad \text{eq. 2}\\ &= 0.50\cos(f_c t) + 0.50\cos(f_c t + F)\\ &= 0.50\{\cos(f_c t) + \cos(f_c t + F)\}\\ &= 0.50\{\cos(f_c t) + \cos(f_c t)\cos(F) - \sin(f_c t)\sin(F)\}\\ &= 0.50\cos(f_c t)\{1 + \cos(F)\} - 0.50\sin(f_c t)\sin(F) \end{aligned}$$

For small F, sin(F) @0, so that we can approximate the above expression as:

$$\begin{aligned} S(t) &= 0.50\cos(f_c t)\{1 + \cos(F)\} \qquad \text{eq. 3}\\ &= \cos(f_c t)\cos^2(F/2) \end{aligned}$$

If the phase difference of the signals in the two paths is zero, there will be no gain attenuation of the signal m(t) at the corner frequency. If however there is a non-zero phase difference between the two signals, $\cos^2(F/2)<1.0$ and there will be attenuation at $f_{loop\ cut-off}$. For example, a phase difference in the high port and low port paths of 40 degrees results in an attenuation of approximately 1.08 dB at the corner frequency. As described above, due to a difference in time delay between the two paths, a phase difference between the high and low path of the prior art modulator results and $\cos^2(F/2)> 1.0$.

The affect of the attenuation of the magnitude response also causes the degradation of the frequency deviation versus time response of the modulator, in particular, it causes an error in the modulation index. FIG. 4A shows an ideal frequency versus time eye diagram for a modulator having a modulation index equal to 0.50 and FIG. 4B shows the frequency deviation versus time eye diagram for a typical prior art modulator. As shown in FIG. 4B, the phase distortion of the prior art modulator not only causes variations along the frequency deviation axis (i.e. modulation index error), but it also causes variations along the time axis (i.e. phase jitter) as illustrated in FIG. 4B.

In accordance with the present invention, FIG. 5 shows a system including a dual port modulator 50 and fixed compromise equalizer 51. The system provides improved overall impulse responses by modulator 50 by applying fixed compromise equalizer 51 to the modulation signal prior to coupling to the input of modulator 50. The equalizer functions as an inverse filter and pre-distorts the modulation signal such that it essentially counteracts the undesired deviations in modulator 50 magnitude response. As indicated in FIG. 5, the response of modulator 50 is H(w) and the response of equalizer 51 is $H^{-1}(w)$. In other words, fixed compromise equalizer 51 is designed to provide the opposite response as that of modulator 50. It is well known in the art of signal processing how to implement a circuit that provides a particular response. For instance, a stereo equalizer is designed such that gain can be manually varied to specific frequencies to provide the desired response to a listener. Another example of a circuit that is designed to provide a given response is a data modem where a fixed compromise equalizer is used to compensate for magnitude and phase distortions in a telephone channel.

FIG. 6 shows the magnitude response of a fixed compromise equalizer as described by the present invention designed to be utilized with a modulator having a magnitude response as illustrated in FIG. 3. As shown, the magnitude response of the equalizer peaks (indicated by 60) at the same frequency at which the modulator magnitude response shown in FIG. 3 dips. In other words, equalizer 51 increases the gain for frequencies at which attenuation occurs in modulator 50 magnitude response. It may be noted that equalizer 50 is designed to account for peak 31 shown in FIG. 3. As shown in FIG. 6, the equalizer response dips (indicated by 61) at the same frequency at which peak 31 (FIG. 3) occurs in the modulator response.

FIG. 7 shows the actual frequency deviation versus time eye diagram for the improved modulator of the present invention in which h=0.50. As can be seen in FIG. 7 all adverse effects (as seen in FIG. 4B) due to the phase delay difference between the high and low modulation paths are eliminated.

One aspect of the present invention is that the inverse response may be convolved with the response of a pre-existing transmitter pulse shaping filter that is coupled to the input of the dual port modulator. Thus, the present invention may be implemented with the addition of very few (if anymore) components.

In the foregoing, a method and system was described for eliminating the undesired effects caused by high port/low port phase differences in a dual port frequency modulator is described. In the description, numerous specific details were set forth, such as particular frequencies and modulation indexes, to provide a thorough understanding of the present invention. It will be obvious, however, to one skilled in the art that these specific details need not be employed to practice the present invention. In other instances, well-known signal processing theory has not been described in detail in order to avoid unnecessarily obscuring the present invention.

Thus, although the elements of the present invention have been described in conjunction with a certain embodiment, it is appreciated that the invention may be implemented in a variety of other ways. Consequently, it is to be understood that the particular embodiment shown and described by way of illustration are in no way intended to be considered limiting. Reference to the details of this embodiment is not intended to limit the scope of the claims which themselves recite only those features regarded as essential to the invention.

What is claimed is:

1. A dual port frequency modulator comprising:

a means for modulating a reference signal with a modulating signal, said modulating means having an associated impulse response;

a means for filtering said modulating signal, said filtering means being coupled to the input of said modulating means, said filtering means having an associated impulse response that is the inverse of said associated impulse response of said modulating means.

2. The dual port frequency modulator as described in claim 1 wherein said modulating means includes a first signal processing path for processing high frequency components of said modulating signal, a second frequency processing path for processing low frequency components of said modulating signal, and a voltage controlled oscillator, wherein said first and second signal processing paths have their inputs coupled to said filtering means and their outputs coupled to said voltage controlled oscillator.

3. The dual port modulator as described in claim 1 wherein said filtering means is a pulse shaping filter.

4. The dual port modulator as described in claim 1 wherein said associated impulse response of said modulating means is nonlinear and wherein the overall impulse response of said dual port frequency modulator is essentially linear.

5. In a dual port frequency modulator having a modulation signal coupled to its input port, said modulation signal being processed through a first signal processing path having a first associated delay and a second signal processing path having a second associated delay, the outputs of said first and second signal processing paths being coupled to a voltage controlled oscillator, wherein the inequality of said first delay and said second delay causes an undesirable modulator impulse response, a method for eliminating said undesirable modulator impulse response comprising the steps of:

pre-distorting said modulation signal prior to coupling it to said input port to generate a pre-distorted signal having an associated pre-distortion impulse response;

setting said pre-distortion impulse response to be equal to the inverse of said undesirable modulator impulse response.

6. The method as described in claim 5 wherein said pre-distortion impulse response is incorporated into a pulse shaping filter.

7. An apparatus comprising:

a first means for processing an analog signal, said first means having an associated impulse response and including a first processing path having a first associated delay time and a second processing path having a second associated delay time, wherein said first and second delays are unequal and wherein the inequality of said first and second delays causes said impulse response of said first means to be nonlinear;

a means for filtering said analog signal before being processed by said first means, said filtering means having an impulse response that is the inverse of said impulse response of said first means.

* * * * *